(12) United States Patent
Jeong et al.

(10) Patent No.: US 9,543,394 B2
(45) Date of Patent: Jan. 10, 2017

(54) QUANTUM ROD AND METHOD OF FABRICATING THE SAME

(71) Applicant: LG DISPLAY CO., LTD., Seoul (KR)

(72) Inventors: Kyung-Seok Jeong, Seoul (KR);
Gee-Sung Chae, Incheon-si (KR);
Jin-Wuk Kim, Goyang-si (KR);
Sung-Hee Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/947,825

(22) Filed: Nov. 20, 2015

(65) Prior Publication Data

US 2016/0087047 A1    Mar. 24, 2016

Related U.S. Application Data

(62) Division of application No. 14/085,073, filed on Nov. 20, 2013, now Pat. No. 9,224,920.

(30) Foreign Application Priority Data

Nov. 23, 2012 (KR) ................ 10-2012-0133815
Nov. 27, 2012 (KR) ................ 10-2012-0135162

(51) Int. Cl.
| | |
|---|---|
| H01L 29/225 | (2006.01) |
| H01L 33/28 | (2010.01) |
| H01L 29/12 | (2006.01) |
| H01L 29/227 | (2006.01) |
| B82Y 10/00 | (2011.01) |
| B82Y 15/00 | (2011.01) |
| B82Y 20/00 | (2011.01) |
| H01L 29/06 | (2006.01) |

(Continued)

(52) U.S. Cl.
CPC ............ *H01L 29/225* (2013.01); *B82Y 10/00* (2013.01); *B82Y 15/00* (2013.01); *B82Y 20/00* (2013.01); *H01L 21/02557* (2013.01); *H01L 21/02601* (2013.01); *H01L 29/0665* (2013.01); *H01L 29/0669* (2013.01); *H01L 29/0673* (2013.01); *H01L 29/125* (2013.01); *H01L 29/127* (2013.01); *H01L 29/22* (2013.01); *H01L 29/227* (2013.01); *H01L 33/285* (2013.01); *H01L 51/502* (2013.01)

(58) Field of Classification Search
CPC ................ H01L 29/125; H01L 29/152; H01L 20/66439; H01L 31/035218; H01L 31/025227
USPC ......... 257/13, E51.04, E53.24; 438/341, 399
See application file for complete search history.

(56) References Cited

U.S. PATENT DOCUMENTS

| | | |
|---|---|---|
| 2004/0026684 A1 | 2/2004 | Empedocles |
| 2004/0127130 A1 | 7/2004 | Yi et al. |

(Continued)

FOREIGN PATENT DOCUMENTS

| | | |
|---|---|---|
| CN | 101842460 A | 9/2010 |
| WO | WO 2012/035535 A1 | 3/2012 |

OTHER PUBLICATIONS

Jiang, Daixun et al., "Synthesis and Luminescence Properties of ZnS:Mn/ZnS Core/Shell Nanorod Structures," J. Material of Science, vol. 44, No. 11, 2009, pp. 2792-2795.

(Continued)

*Primary Examiner* — Tan N Tran
(74) *Attorney, Agent, or Firm* — Brinks Gilson & Lione

(57) ABSTRACT

A quantum rod includes a core of ZnS semiconductor particle having a rod shape; and a transition metal with which the core is doped and which is biased at one side of a length direction of the core.

6 Claims, 6 Drawing Sheets

(51) Int. Cl.
*H01L 29/22* (2006.01)
*H01L 21/02* (2006.01)
*H01L 51/50* (2006.01)

(56) References Cited

U.S. PATENT DOCUMENTS

| | | |
|---|---|---|
| 2005/0167646 A1 | 8/2005 | Banin et al. |
| 2008/0150165 A1 | 6/2008 | Stumbo et al. |
| 2010/0003516 A1 | 1/2010 | Majumdar et al. |
| 2013/0098288 A1 | 4/2013 | Samuelson et al. |

OTHER PUBLICATIONS

Office Action dated Dec. 4, 2015 for corresponding Chinese Patent Application No. 201310596775.5, 22 pages.
Office Action dated May 13, 2016 for Chinese Application No. 201310596775.5, 18 pages.
Yao, Tingting et al., "Facile Synthesis Optical Properties and Growth Mechanism of Elongated Mn-Doped $ZnSe_{1-x}S_x$ Nanocrystals," The Royal Society of Chemistry, vol. 14, 2012, pp. 8440-8445.
Carbone, Luigi et al., "Synthesis and Micrometer-Scale Assembly of Colloidal CdSe/CdS Nanorods Prepared by a Seeded Growth Approach," Nano Letters, vol. 7, No. 10, 2007, 15 pages.
Dorfs, Dirk et al., "ZnSe Quantum Dots Within CdS Nanorods: A Seeded-Grow Type-II System," Small, vol. 4, No. 9, 2008, pp, 1319-1323.
Office Action dated Aug. 19, 2016 for Chinese Application No. 201310596775.5, 23 pages.

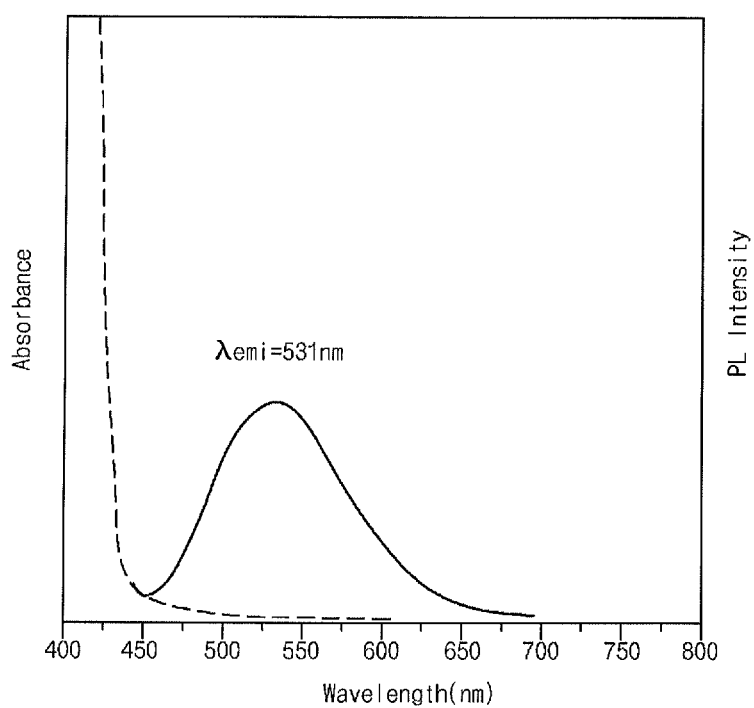

QUANTUM ROD AND METHOD OF FABRICATING THE SAME

The present application claims priority to and is a divisional application of U.S. patent application Ser. No. 14/085,073, filed on Nov. 20, 2013, which claims the benefit of Korean Patent Application Nos. 10-2012-0133815 and 10-2012-0135162, filed in Korea on Nov. 23, 2012 and Nov. 27, 2012, which are hereby incorporated by reference for all purposes as if fully set forth herein.

BACKGROUND

Field of the Disclosure

The present disclosure relates to a quantum rod, and more particularly, to a liquid crystal display device having light weight, a quantum rod and a method of fabricating the same.

Discussion of the Prior Art

Generally, chemical and physical properties of solid crystal do not relate size of crystal. However, when size of solid crystal is several nanometers, such the size may be a variable that influences crystalline chemical and physical properties. Research of forming nanocrystal or quantum dot as a semiconductor material out of nano technologies that use distinctive properties of particles having such the nano size have been actively progressing.

Particularly, the prior inorganic light emission element, which is a semiconductor used as a light emission layer formed in thin film type with a chemical vapor deposition (CVD), has the disadvantage of low efficiency of electrical to optical conversion. The is an increasing interest on high efficient light emission elements using nano materials. Among the elements, a quantum dot of several nanometer size has a distinctive behavior of quantum effect and is know to be used for a semiconductor structure to produce a high efficient illumination element, an illuminated signs for in vivo molecules, and etc.

A quantum dot, and a quantum rod, which has a rod shape by crystal growth of a hexagonal structure as a crystalline structure is grown in one direction emit different lights according to sizes thereof.

Generally, since wavelength of light produced is shorter as size of the particle is smaller and wavelength of light produced is longer as size of the particle is greater, sizes of the quantum dot and the quantum rod are required to be appropriately adjusted.

However, since the quantum dot and the quantum rod have very small size, surface-volume ratio is very great, and atoms located on the surface have very high reactivity thus is prone to contact with grow into greater particle by contacting particle therearound.

To prevent this, a precipitation method, pyrolysis method, vapor phase growth, template synthesis, and etc. are suggested, and initial compound quantum dot and quantum rod consist of II-VI, III-V, or IV-VI group single semiconductor particle (e.g., CdSe, CdS, GaAs, GaP, GaAs—P, Ga—Sb, InAs, InP, InSb, AlAs, ALP, AlSbCuInSe$_2$, CuInS$_2$, AgInS$_2$, PbS, PbSe, or PbTe).

Research of the quantum dot is made on a principle basis of changing structure of nano crystal, such as size, surface and etc. of nano crystal, in the nanometer region, thus changing property of crystal i.e., changing band gap.

The quantum dot has different illumination ranges, illumination efficiencies, chemical stability and etc. according to compositions thereof, and thus application range and application method are limited.

Particularly, the quantum rod having high efficient illumination property and polarization property as well has illumination efficiency much less than the quantum dot.

This is because the quantum rod has a rod shape differently from the quantum dot of spherical shape, thus a shell of length is greater than Bohr radius of exciton, and thus quantum confinement effect is reduced.

Accordingly, research having high efficient illumination property and polarization property is required.

Moreover, single-layered quantum dot and quantum rod are very unstable because a cationic surface or anionic surface is protected from the outside, and by capping it with other type semiconductor, a stable quantum rod can be formed.

When the quantum rod of such the core/shell structure is formed, size of band gap is freely adjusted, and the quantum rod of core/shell structure can be categorized into I type and II type.

In the I type core/shell structure, for example, when a material of small band gap is placed and formed at a core and a material of big band gap is placed and formed at a shell, a quantum well is produced between the core and the shell, and the core is capped with the shell, and thus it is more stable than a single-material quantum rod.

Further, since electrons are spread all over the quantum rod, holes are confined to the core, photooxidation due to hole-surface recombination is prevented and thus stable illumination property is obtained.

In other words, the quantum dot of the I type core/shell structure is a quantum dot having a shell that is formed on a surface of a core and has a band gap greater than that of the core, and the shell on the surface of the core has the band gap based on a valence band of lower energy than that of the core and has a conduction band of higher energy than that of the core.

In the II type core/shell structure, when the core and shell are formed of materials having different band gap offsets, holes and electrons are confined to the core and shell, respectively, and thus light corresponding to difference between band gap offsets of the two material is emitted.

When a quantum rod having such the core/shell structure is formed, lights in various colors are emitted according to combination of core/shell, for example, the quantum rod of core/shell structure includes semiconductor particles such as CdSe/CdS, ZnSe/CdS, CdTe/CdSe and CdSe/CdTe.

The quantum dot has different illumination ranges, illumination efficiencies, chemical stability and etc. according to compositions thereof, and thus application range and application method are limited.

Particularly, the quantum rod having high efficient illumination property and polarization property as well has illumination efficiency much less than the quantum dot.

This is because the quantum rod has a core or shell surrounding the core that has a rod shape differently from the quantum dot of spherical shape, thus a shell of length is greater than Bohr radius of exciton, and thus quantum confinement effect is reduced.

The quantum rod is formed in a crystalline structure of hexagonal, wurtzite, or zincbland structure, and such the structure is well formed of for example, semiconductor particle of CdS.

Accordingly, it is preferred that the quantum rod of core/shell structure is formed to include CdS, in case that CdSe and ZnSe is used for the core and CdS is used for the shell, the quantum rod only produces a color region from yellow to red (i.e., from 510 nm to 780 nm).

In other words, it is very difficult for the quantum rod to produce a blue color region of 450 nm to 480 nm.

SUMMARY

A quantum rod includes a core of ZnS semiconductor particle having a rod shape; and a transition metal with which the core is doped and which is biased at one side of a length direction of the core.

In another aspect, a method of fabricating a quantum rod includes forming a core nanocrystal using ZnS semiconductor particle; doping a surface of the core nanocrystal with a transition metal; and growing the core nanocrystal into rod shape.

In yet another aspect, a quantum rod includes an alloy core of mixed first semiconductor particle and second semiconductor particle; and a shell in rod shape on a surface of the alloy core, and of one having a greater band gap out of the first and second semiconductor particles.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3 is a graph of a light emitting spectrum of the quantum rod according to the first embodiment of the present invention;

DETAILED DESCRIPTION OF THE ILLUSTRATED EMBODIMENTS

Reference will now be made in detail to the illustrated embodiments of the present invention, which are illustrated in the accompanying drawings.

Figure 1:
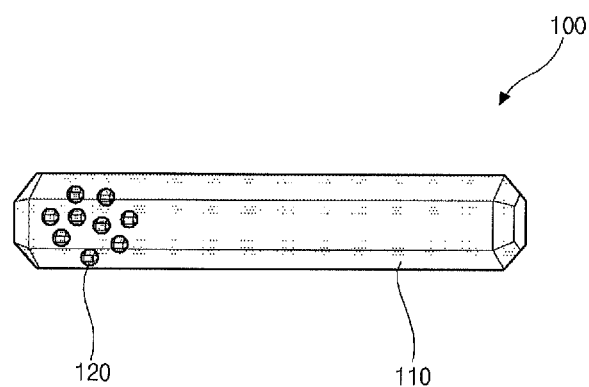
FIG. 1 is a schematic view illustrating a quantum rod according to a first embodiment of the present invention.

FIG. 1 is a schematic view illustrating a quantum rod according to a first embodiment of the present invention.

The quantum rod 100 has a nanometer size, has a distinctive behavior of quantum effect, and is know to be used for a semiconductor structure to produce a high efficient illumination element, an illuminated signs for in vivo molecules, and etc.

Research of the quantum rod 100 is made on a principle basis of changing structure of nano crystal, such as size, surface and etc. of nano crystal, in the nanometer region, thus changing property of crystal i.e., changing band gap.

Materials, including semiconductor material, are combined with atomic electron orbital changing into molecular electron orbital. The molecular electron orbital forms a bonding molecular orbital and an antibonding molecular orbital with each of two pairs of electron orbitals of atomic state participating. In this case, a band formed by many bonding orbitals is referred to as a valence band, and a band formed by many antibonding orbitals is referred to as a conduction band.

A highest energy level of the valence band is referred to as a HOMO (highest occupied molecular orbital), and a lowest energy level of the conduction band is referred to as a LUMO (lowest unoccupied molecular orbital), and an energy difference between the HOMO level and the LUMO level is defined as a band gap.

The quantum rod 100 includes a core 110 having a rod shape, and a total size of the quantum rod 100 may be a nanocrystal size of about 10 nm to about 10000 nm.

The core 100 has the rod shape with a major axis and a minor axis, and a cross-section taken along the minor axis direction may be in a circular, elliptical, or polygonal shape.

The quantum rod 100 has minor axis to major axis ratio of about 1:1.1 to about 1:30.

The quantum rod 100 emits fluorescent light as an electron in exited state descends from the conduction band to the valence band.

The quantum rod 100 has property different from a usual fluorescent dye, and even though the cores are formed of the same material, fluorescent wavelength is varied according to size of particle. In other words, wavelength of fluorescent light is shorter as size of particle is greater, and lights of wavelengths in the visible light region can be almost produced.

The quantum rod 100 has a high quantum yield, and thus very strong fluorescent light can be produced.

Particularly, the quantum rod 100 has a polarization property of transmitting lights of specific direction and absorbing or reflecting other lights.

In other words, the quantum rod 100 has a property of absorbing or reflecting lights of a specific direction among lights incident thereon. Since a polarizing axis of the quantum rod 100 is formed along a length direction of the quantum rod 100, component of lights parallel with the length direction of the quantum rod 100 is absorbed or reflected, and other component of the lights perpendicular to the length direction of the quantum rod 100 is transmitted.

A structure of an illumination element using the quantum rod 100 is explained as follows.

The illumination element using the quantum rod 100 includes a quantum rod layer between an anode and a cathode.

In the illumination element, a hole injected into the quantum rod layer through a hole injection layer from the anode, and an electrode injected into the quantum rod layer through an electrode injection layer from the cathode is recombined to produce exciton, and light corresponding to a band gap of the quantum rod layer is emitted from the exciton.

Since the quantum rod 100 is a fluorescent material, a light source such as a UV (ultraviolet) is required, and the UV light is radiated into the quantum rod 100 thus various colors can be realized.

Since the quantum rod 100 has polarization property, lights of a specific direction among lights incident on the quantum rod 100 can be selectively transmitted.

In case that the illumination element using the quantum rod 100 is applied to a liquid crystal display device, one of two polarizing plates can be eliminated, and when the quantum rod 100 reflects light, loss of light can be minimized.

In other words, when the quantum rod 100 is configured to transmit light having polarization perpendicular to the polarizing axis of the quantum rod and reflect other light, the reflected light can change in polarization state and be recycled as scattering light close to natural light.

Since the recycled light is resupplied to the quantum rod 100, a part of the light passes through the quantum rod 100 while other part of the light is reflected again. Accordingly, such the light recycling is repeated continuously, and thus loss of light can be minimized.

The quantum rod 100 is characterized by doping the rod-shaped core 100 anisotropically with a transition metal.

In other words, the core 100 may be formed of a ZnS series semiconductor particle, and the ZnS series semiconductor particle has a property of emitting blue. However, since the quantum rod 100 is formed in rod shape, the length of the quantum rod 100 is longer than Bohr radius of exciton, thus quantum confinement effect is reduced, and thus substantially no light is emitted.

Accordingly, the ZnS series semiconductor particle has property of substantially being transparent to visible light.

By doping the core 110 made of the ZnS series semiconductor particle with transition metal of $Cu^{2+}$ that emits green fluorescent light, the quantum rod 100 has polarization property due to the rod-shaped core 100 and emits green color with high efficiency due to the $Cu^{2+}$ transition metal as well.

In other words, when the core 110 of the ZnS semiconductor particle is doped with the Cu2+ transition metal, the green light of about 500 nm is emitted.

Accordingly, the embodiment realizes the quantum rod 100 having high efficient green illumination property and polarization property.

The ZnS series particle may be selected from ZnSe, ZnO, ZnS, $Zn_xCd_{1-x}Se$, and $Zn_xCd_{1-x}S$ (where 0<X<1).

It is preferred, but not required that the $Cu^{2+}$ transition metal has a weight % of about 0.1 to about 50 with respect to a host i.e., the ZnS series semiconductor particle.

Alternatively, instead of the $Cu^{2+}$ transition metal, $Tb^{3+}$ transition metal may be used to emit green.

Further, by doping with transition metal to produce desired color, various colors can be emitted. For example, when the core 110 of ZnS series semiconductor material doped with Mn2+ transition metal, red light of about 600 nm can be emitted.

The quantum rod 100 is characterized in that in the doping, the $Cu^{2+}$ transition metal is biased in the core 110 to one side of the length direction of the quantum rod 100.

This is for holes and electrons being not interrupted by the Cu2+ transition metal 120 spread in the core 110 when adjusting fluorescent amount or luminous amount by applying an electric field to the quantum rod 100 and fluorescent amount or luminous amount.

As such, self absorption of the hole and electron can be reduced.

In other words, before an electric field is applied along the length direction of the quantum rod 100, the electron and the hole are in combined state, but when the electric field is applied along the length direction of the quantum rod 100, the hole and the electron are spatially separated and thus separation of band gap can be induced.

Accordingly, the fluorescent amount or luminous amount from the quantum rod 100 can be adjusted. On the contrary, in case that the $Cu^{2+}$ transition metal is spread entirely in the quantum rod 100 in the doping, when an electric field is applied along the length direction of the quantum rod 100, the hole and the electron are interrupted by the $Cu^{2+}$ transition metal in the process of separating the hole and the electron.

Accordingly, the separation of the hole and electron is not easy, and thus the separation of band gap is not easily induced, and some electrons collide with the Cu2+ transition metal and are self-absorbed.

Accordingly, by biasing the $Cu^{2+}$ transition metal to one side of the length direction of the quantum rod 100 in the doping, when an electric field is applied to the quantum rod 100, the hole and the electron can be prevented from being interrupted by the $Cu^{2+}$ transition metal.

Accordingly, the fluorescent amount or luminous amount of the quantum rod 100 can be adjusted, and self-absorption of electron can be prevented.

In this embodiment, the doping may not be performed in a state that the quantum rod 100 is finally formed, but the doping may be performed before forming the quantum rod 100 and thus the transition metal may be formed to be biased to the one side of the length direction of the quantum rod 100.

In other words, the quantum rod 100 may be fabricated by: (a) forming the core 100 of nanocrystal; (b) doping the surface of the nanocrystal core 110 with the transition metal; and (c) growing the nanocrystal core 110 into a rod shape.

The method of fabricating the quantum rod 100 is explained with reference to FIGS. 2A to 2D.

Figure 2A:
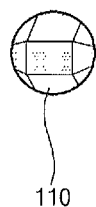
FIGS. 2A to 2D are views illustrating a method of fabricating the quantum rod according to the first embodiment of the present invention.

As shown in FIG. 2A, the nanocrystal core 110 is formed using the ZnS series semiconductor particle. This process may be performed in a usual process of forming a core.

Figure 2B:
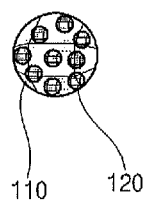

Then, as shown in FIG. 2B, the nanocrystal core 110 and a precursor solution of the $Cu^{2+}$ transition metal are mixed and react together, and thus the nanocrystal core 110 doped with the $Cu^{2+}$ transition metal is formed.

Figure 2C:
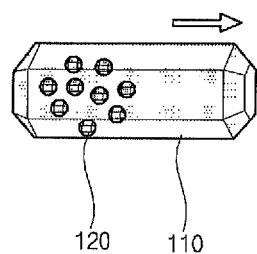
Figure 2D:
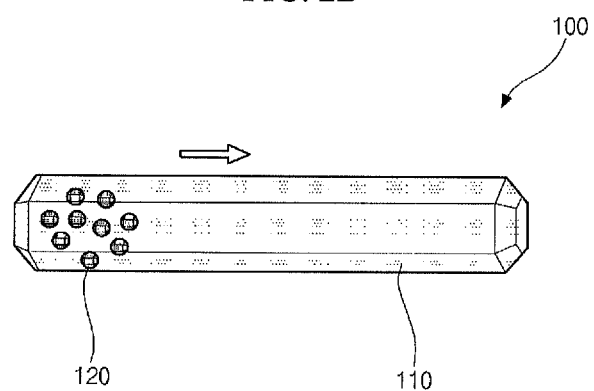

Then, as shown in FIGS. 2C and 2D, the nanocrystal core 110 doped with the $Cu^{2+}$ transition metal is grown.

In the above method, a dispersing agent may be additionally used when a precursor of each element is mixed with a solvent, and mixing the reacting materials may be performed simultaneously or sequentially and a sequence of the mixing may be adjusted.

An experimental example of this embodiment is explained as follows.

Experimental Example: Doping a quantum rod having ZnS series semiconductor particles with $Cu^{2+}$ Zinc stearate (Zn-St2), octadecene (ODE) and octadecylamine (ODA) are put in a reaction apparatus, and the apparatus is heat to 120 degrees Celsius under nitrogen atmosphere to remove moisture and air.

Separately, Se powder is dissolved in tributylphosphine (TBP) to form a Se-TBP complex solution.

Then, the apparatus is heat to 300 degrees Celsius under nitrogen flow, then the Se-TBP is injected, and then reaction is performed at 300 degrees Celsius for one hour.

After the reaction is finished, a temperature of the reacted mixture is reduced to a room temperature as soon as possible, then an ethanol of a non-solvent is added and a centrifugation is performed. A supernatant of a solution, except for a precipitation, centrifuged is thrown away, and the precipitation is dispersed in toluene to form ZnS semiconductor particles.

Then, the ZnS semiconductor particles are doped with Cu2+, and then the doped ZnS semiconductor particles, the ODA, Zn-St2, dimethylformamide (DMF) are put in a hydrothermal reaction apparatus, and reaction is performed at 230 degrees Celsius for six hours.

Then, after the reaction is finished, a temperature of the reacted mixture is reduced to a room temperature as soon as possible, then an ethanol of a non-solvent is added and a centrifugation is performed. A supernatant of a solution, except for a precipitation, centrifuged is thrown away, and the precipitation is dispersed in toluene to form a quantum rod in rod shape with Cu2+ biased to one side of a length direction of the quantum rod.

A light emitting spectrum of the quantum rod fabricated above emitting green light is shown in FIG. 3. Referring to FIG. 3, it is shown that the quantum rod of this embodiment having a core of ZnS series semiconductor particles doped with $Cu^{2+}$ can emit green light of wavelength of about 500 nm.

The quantum rod of this embodiment can be variously applied as an electronic element in a field such as sensor, and particularly, can be applied to an organic thin film of a light emitting diode, and more particularly, for a light emitting layer. When the quantum rod is applied to the light emitting diode, a vacuum deposition method, a sputtering method, a printing method, a coating method, a inkjet method, or a method using electron beam.

The organic thin film may be referred to as a film made of organic material, which is formed between a pair of electrodes of the organic light emitting diode, such as the light emitting layer, an electron transporting layer, a hole transporting layer, or the like.

The organic light emitting diode may be formed, but not required, to have a usual structure of anode/light emitting layer/cathode, anode/buffer layer/light emitting layer/cathode, anode/hole transporting layer/light emitting layer/cathode, anode/buffer layer/hole transporting layer/light emitting layer/cathode, anode/buffer layer/hole transporting layer/light emitting layer/electron transporting layer/cathode, anode/buffer layer/hole transporting layer/light emitting layer/hole blocking layer/cathode, or the like.

The buffer layer may be formed of a material usually used, and preferably, but not limited to, copper phthalocyanine, polythiophene, polyaniline, polyacetylene, polypyrrole, polyphenylene vinylene, or derivative of one of them.

The hole transporting layer may be formed of a material usually used, and preferably, but not limited to, polytriphenylamine.

The electron transporting layer may be formed of a material usually used, and preferably, but not limited to, polyoxadiazole.

The hole blocking layer may be formed of a material usually used, and preferably, but not limited to, LiF, $BaF_2$ or $MgF_2$.

As described above, the quantum rod of this embodiment is fabricated to have the core of the ZnS series semiconductor particles doped with Cu2+ biased to one side of the length direction of the quantum rod. Accordingly, polarization property due to the rod-shaped core and high efficient green color illumination due to the $Cu^{2+}$ as well can be achieved.

Figure 4:
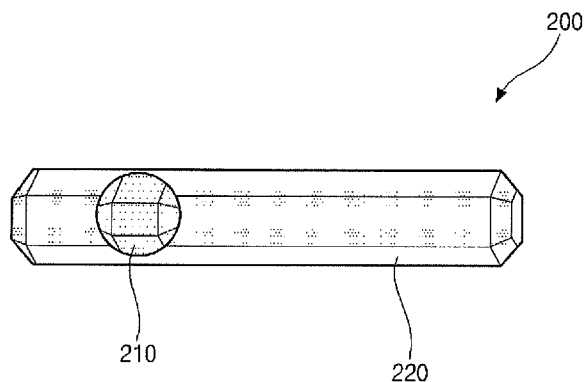
FIG. 4 is a schematic view illustrating a quantum rod according to a second embodiment of the present invention.

FIG. 4 is a schematic view illustrating a quantum rod according to a second embodiment of the present invention.

In the second embodiment, explanation parts similar to parts of the first embodiment may be omitted.

The quantum rod 200 has a nanometer size, has a distinctive behavior of quantum effect, and is know to be used for a semiconductor structure to produce a high efficient illumination element, an illuminated signs for in vivo molecules, and etc.

Research of the quantum rod 100 is made on a principle basis of changing structure of nano crystal, such as size, surface and etc. of nano crystal, in the nanometer region, thus changing property of crystal i.e., changing band gap.

Materials including semiconductor material are combined with atomic electron orbital changing into molecular electron orbital. The molecular electron orbital forms a bonding molecular orbital and an antibonding molecular orbital with each of two pairs of electron orbitals of atomic state participating. In this case, a band formed by many bonding orbitals is referred to as a valence band, and a band formed by many antibonding orbitals is referred to as a conduction band.

A highest energy level of the valence band is referred to as a HOMO (highest occupied molecular orbital), and a lowest energy level of the conduction band is referred to as a LUMO (lowest unoccupied molecular orbital), and an energy difference between the HOMO level and the LUMO level is defined as a band gap.

The quantum rod 200 of a core/shell structure includes a core 210, and a shell 220 of rod shape wrapped around the core 210.

The core 210 has a nanocrystal size of about 3 nm to about 1000 nm, and the quantum rod 200 has a nanocrystal size of about 10 nm to about 10000 nm.

The core 210 may have a spherical shape, elliptically spherical shape, polyhedral shape, or rod shape, and the shell 220 has a rod shape and a cross-section of the shell 220 taken along the minor axis direction of the quantum rod 200 may be in a circular, elliptical, or polygonal shape.

The shell 220 has minor axis to major axis ratio of about 1:1.1 to about 1:30.

The quantum rod 200 emits fluorescent light as an electron in exited state descends from the conduction band to the valence band.

The quantum rod 200 has property different from a usual fluorescent dye, and even though the cores are formed of the same material, fluorescent wavelength is varied according to size of particle. In other words, wavelength of fluorescent light is shorter as size of particle is greater, and lights of wavelengths in the visible light region can be almost produced.

The quantum rod 200 has a high quantum yield, and thus very strong fluorescent light can be produced.

Particularly, the quantum rod 200 has a polarization property of transmitting lights of specific direction and absorbing or reflecting other lights.

In other words, the quantum rod 200 has a property of absorbing or reflecting lights of a specific direction among lights incident thereon. Since a polarizing axis of the quantum rod 200 is formed along a length direction of the quantum rod 200, component of lights parallel with the length direction of the quantum rod 200 is absorbed or reflected, and other component of the lights perpendicular to the length direction of the quantum rod 200 is transmitted.

Since the quantum rod 200 is a fluorescent material, a light source such as a UV (ultraviolet) is required, and the UV light is radiated into the quantum rod 100 thus various colors can be realized.

Since the quantum rod 200 has polarization property, lights of a specific direction among lights incident on the quantum rod 200 can be selectively transmitted.

In case that the illumination element using the quantum rod 200 is applied to a liquid crystal display device, one of two polarizing plates can be eliminated, and when the quantum rod 200 reflects light, loss of light can be minimized.

In other words, when the quantum rod 200 is configured to transmit light having polarization perpendicular to the polarizing axis of the quantum rod and reflect other light, the reflected light can change in polarization state and be recycled as scattering light close to natural light.

Since the recycled light is resupplied to the quantum rod 200, a part of the light passes through the quantum rod 200 while other part of the light is reflected again. Accordingly, such the light recycling is repeated continuously, and thus loss of light can be minimized.

The quantum rod 200 has a band gap by a valence band of the shell 220 having lower energy than a valence band of the core 210, and a conduction band of the shell 220 having higher energy than a conduction band of the core 210. The core 210 may be formed of the mixture of two semiconductor particles, and the shell 220 may be formed of one having higher band gap out of the two semiconductor particles.

In other words, the core 210 may be made of two selected out of CdSe, ZnS, CdS, ZnTe, CdSe, CdS, CdTe, ZnO, ZnSe, ZnS, ZnTe, HgSe, HgTe, CdZnTe, InP, InN, GaN, InSb, InAsP, InGaAs, GaAs, GaP, GaSb, AlP, AlN, AlAs, AlSb, CdSeTe, ZnCdSe, PbSe, PbTe, PbS, PbSnTe, $Tl_2SnTe_5$, and the shell 220 may be made of one having a higher band gap out of the selected two semiconductor particles.

For example, the core 210 is made of an alloy semiconductor particle of the mixed semiconductor particles of ZnS and CdS, and the shell 220 is made of ZnS.

The CdS semiconductor particle is required for forming the quantum rod 200 having a hexagonal, wurtzite or zincbland crystalline structure.

The ZnS semiconductor particle is capable of emitting blue light of 450 nm to 480 nm. By forming the core 210 using the alloy semiconductor particle of the mixed ZnS semiconductor particle and CdS semiconductor particle, the quantum rod 200 emitting blue light can be achieved.

By forming the shell 200 using the ZnS semiconductor particle, the quantum rod 200 having high efficient illumination can be achieved.

The quantum rod 200 includes the core 210 of the mixture of two semiconductor particles, and the shell 220 of one having a higher band gap out of the two semiconductor particles.

In contrast with a usual quantum rod, difference of band gap between the core 210 and the shell 220 of the quantum rod 200 is reduced, and thus quantum-mechanical wave function of electron and hole, which is produced in the quantum rod 200 in excited state, can be maintained well.

In other words, because of the core/shell structure of this embodiment designed such that difference of band gap between the core 210 and the shell 220 is reduced, the electron and hole directly relevant to illumination of the quantum rod 200 can stably exist, and thus high efficient illumination, high clear illumination and high chemical stability can be achieved.

The quantum rod 200 is characterized in that in order to reduce difference of band gap between the core 210 and the shell 220, the quantum rod 200 is designed using the core 110 of semiconductor particles having a specific band gap and the shell 220 of one of the semiconductor particles.

Considering this, the core 210 may be formed of one selected out of $Zn_xCd_{1-x}Se$, $Zn_xCd_{1-x}S$, $CdSe_xS_{1-x}$, $ZnTe_xSe_{1-x}$, $ZnSe_xS_{1-x}$, $Zn_xIn_{1-x}S$, $Zn_xIn_{1-x}Se$, $Zn_xIn_{1-x}Te$, $Cu_xIn_{1-x}S$, $Cu_xIn_{1-x}Te$ and $GaP_xN_{1-x}$ (where 0<x<1), and the shell 220 may be formed of one having a higher band gap out of the selected two.

In this case, the quantum rod 200 is formed to have a hexagonal, wurtzite, or zincbland structure, and such the crystalline structure can be formed using CdS semiconductor particle, and thus it is preferred that the CdS semiconductor particle is included.

Particularly, to achieve blue light of 450 nm to 480 nm, the core 210 is made of the alloy semiconductor particle of the mixed ZnS semiconductor particle and CdS semiconductor particle, and the shell 220 is made of the ZnS semiconductor particle.

This is described in more detail with reference to FIGS. 5A and 5B.

Figure 5A:
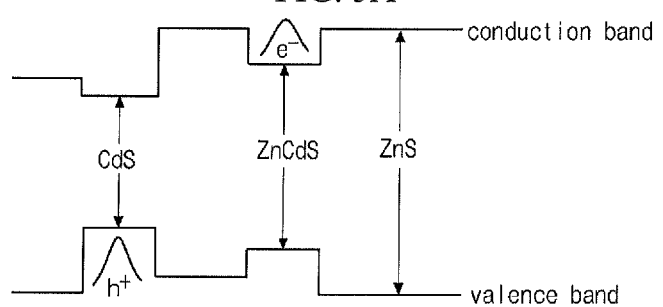
FIGS. 5A and 5B are graphs of band gaps of semiconductor particles according to the second embodiment of the present invention.
Figure 5B:
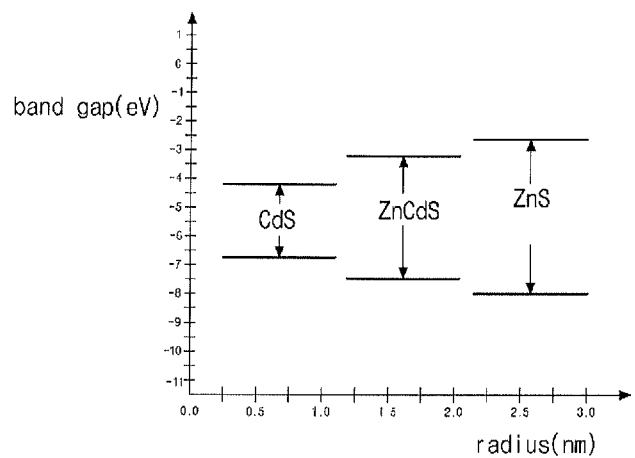

FIGS. 5A and 5B are graphs of band gaps of semiconductor particles according to the second embodiment of the present invention.

As shown in FIG. 5A, the CdS semiconductor particle has a valence band of a higher energy than a valence band of the ZnS semiconductor particle, and has a conduction band of a lower energy than a conduction band of the ZnS semiconductor particle.

The ZnCdS semiconductor particle, which is the alloy semiconductor particle of the mixed CdS semiconductor particle and ZnS semiconductor particle, has a valence band of a lower energy than a valence band of the CdS semiconductor particle and of a higher energy than a valence band of the ZnS semiconductor particle, and has a conduction band of a higher energy than a conduction band of the CdS semiconductor particle and of a lower energy than a conduction band of the ZnS semiconductor particle.

In other words, as shown in FIG. 5B, a difference of band gap between the CdS semiconductor particle forming the core of the prior art and the ZnCdS used for the core 210 of the mixture of the CdS semiconductor particle and the ZnS semiconductor particle is about 1 eV.

As shown in FIG. 5B, a difference of band gap between the ZnCdS used for the core 210 and the ZnS semiconductor particle used for the shell 220 is about 0.5 eV.

Accordingly, in case of the quantum rod of the prior art having the core of the CdS semiconductor particle and the shell of ZnS, a difference of band gap between the core and the shell is about 1.5 eV. However, in this embodiment, a difference of band gap between the core 210 and the shell 220 can be about 0.5 eV, as described above.

In other words, the quantum rod 200 of the embodiment has the difference of band gap between the core 210 and the shell 220 reduced, and thus the electron and hole directly relevant to illumination of the quantum rod 200 can stably exist, and thus high efficient illumination, high clear illumination and high chemical stability can be achieved.

In the embodiment as above, the quantum rod 200 having the core 210 made of the mixture and the shell 220 with which the core is capped is shown. Alternatively, a ligand surrounding the quantum rod 200 may be used according to dispersing solvent. A terminal tend of the ligand may have hydrophobic ligand, hydrophilic ligand or silicon ligand according to dispersing solvent.

An experimental example of this embodiment is explained as follows.

Experimental Example

Synthesizing Quantum Rod Having a Core of Alloy Semiconductor Particle of Mixed CdS and ZnS and a Shell of ZnS Cd power is dissolved in octadecylamine (OA) to form a Cd-OA complex solution, and Zn power is dissolved in OA to form a Zn-OA complex solution.

A temperature of a reaction is adjusted to 300 degrees Celsius agitating the Cd-OA complex solution the Zn-OA complex solution.

After the reaction is finished, a temperature of the reacted mixture is reduced to a room temperature as soon as possible, then an ethanol of a non-solvent is added and a centrifugation is performed. A supernatant of a solution, except for a precipitation, centrifuged is thrown away, and the precipitation is dispersed in toluene to synthesize a nanocyratal solution of $Zn_xCd$ alloy emitting light of 459 nm.

Then, the synthesized nanocyratal solution of $Zn_xCd$ alloy is added into the reactant, then a S-OA complex solution is slowly added and a reaction is performed at 270 degrees Celsius for one hour.

Then, after the reaction is finished, a temperature of the reacted mixture is reduced to a room temperature as soon as possible, then an ethanol of a non-solvent is added and a centrifugation is performed. A supernatant of a solution, except for a precipitation, centrifuged is thrown away, and the precipitation is dispersed in toluene to synthesize a nanocyratal solution of $Zn_xCd_{1-x}S$ alloy emitting light of 459 nm.

Separately, zinc sulfate and dodecylamine are dried at 80 degrees Celsius for one hour, and then agitated for three hours.

Then, sulfur in power state is injected, then agitation is performed for 10 minutes, and then agitation is performed in autoclave at a reaction temperature of 200 degrees Celsius for one and a half hours.

Then, a HX (X=F, Cl, Br, or I) gas is injected, and then a centrifugation is performed. A supernatant of a solution, except for a precipitation, centrifuged is thrown away, and the precipitation is dispersed in toluene, then ZnS nanocrystal is grown on a surface of the $Zn_xCd_{1-x}S$ alloy nanocrystal to synthesize a quantum rod of core/shell structure of $Zn_xCd_{1-x}S/ZnS$.

Figure 6:
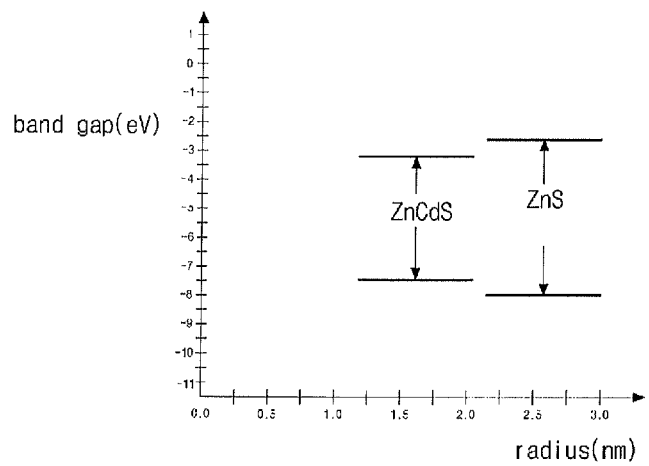
FIG. 6 is a graph of a band gap of the quantum rod according to the second embodiment of the present invention.

A band gap of the quantum rod having the core of the mixed semiconductor particles and the shell of one of the mixed semiconductor particles is shown in FIG. 6.

In this embodiment, a difference of band gap between the core 210 of the mixed CdS and ZnS and the shell 220 of ZnS can be about 0.5 eV, thus the difference of band gap between the core 210 and the shell 220 can be reduced. Accordingly, the electron and hole directly relevant to illumination of the quantum rod 200 can stably exist, and thus high efficient illumination, high clear illumination and high chemical stability can be achieved.

Figure 7:
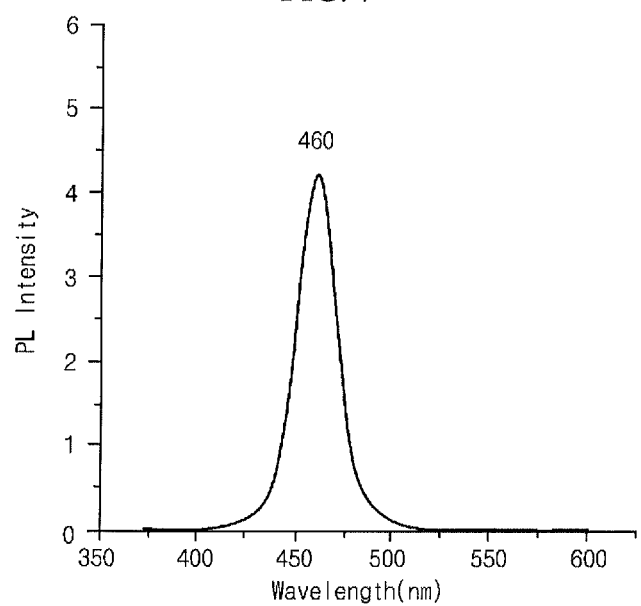
FIG. 7 is a graph of a light emitting spectrum of the quantum rod according to the second embodiment of the present invention.

A light emitting spectrum of the quantum rod of this embodiment is shown in FIG. 7. Referring to FIG. 7, it is shown that the quantum rod having the core of the mixed CdS and ZnS and the shell of ZnS can emit blue light of wavelength of 450 nm to 480 nm.

As described above, the core 210 is formed in alloy type by mixing at least two materials of different band gaps, and the shell 220 is formed of one having a higher band gap out of the materials forming the core 210, and thus high efficient illumination can be achieved.

Accordingly, the quantum rod of this embodiment can be applied to various light emitting elements by utilizing the quantum rod for a light emitting layer.

Particularly, the quantum rod is useful for forming an organic thin film of a light emitting diode, and more particularly, for forming a light emitting layer.

When the quantum rod is applied to the light emitting diode, a vacuum deposition method, a sputtering method, a printing method, a coating method, an inkjet method, or a method using electron beam.

The organic thin film may be referred to as a film made of organic material, which is formed between a pair of electrodes of the organic light emitting diode, such as the light emitting layer, an electron transporting layer, a hole transporting layer, or the like.

The organic light emitting diode may be formed, but not required, to have a usual structure of anode/light emitting layer/cathode, anode/buffer layer/light emitting layer/cathode, anode/hole transporting layer/light emitting layer/cathode, anode/buffer layer/hole transporting layer/light emitting layer/cathode, anode/buffer layer/hole transporting layer/light emitting layer/electron transporting layer/cathode, anode/buffer layer/hole transporting layer/light emitting layer/hole blocking layer/cathode, or the like.

The buffer layer may be formed of a material usually used, and preferably, but not limited to, copper phthalocyanine, polythiophene, polyaniline, polyacetylene, polypyrrole, polyphenylene vinylene, or derivative of one of them.

The hole transporting layer may be formed of a material usually used, and preferably, but not limited to, polytriphenylamine.

The electron transporting layer may be formed of a material usually used, and preferably, but not limited to, polyoxadiazole.

The hole blocking layer may be formed of a material usually used, and preferably, but not limited to, LiF, $BaF_2$ or $MgF_2$.

As described above, in the embodiment, the quantum rod includes the core of the mixture of two semiconductor particles, and the shell of one having a higher band gap out of the two semiconductor particles, and thus the difference of band gap between the core and the shell can be reduced. Accordingly, the electron and hole directly relevant to illumination of the quantum rod 200 can stably exist, and thus high efficient illumination, high clear illumination and high chemical stability can be achieved.

Moreover, the core is made of the mixed CdS and ZnS and the shell is made of ZnS, and thus blue light of wavelength of 450 nm to 480 nm can be emitted.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a quantum rod comprising:
   forming a core nanocrystal using semiconductor particle;
   doping a surface of the core nanocrystal with a transition metal; and
   growing the core nanocrystal into rod shape,
   wherein the grown core nanocrystal is doped with the transition metal only at one of longitudinal ends of the grown core nanocrystal, and the other one of the longitudinal ends of the grown core nanocrystal is not doped with any other chemical element,
   wherein the grown core nanocrystal is made of a chemical compound including Zn and the transition metal is a metal selected from a group consisting of $Cu^{2+}$, $Tb^{3+}$ and $Mn^{2+}$, the transition metal has a weight % of about 0.1 to about 50 with respect to the grown core nanocrystal, and a size of the grown core nanocrystal is about 10 nm to about 10000 nm.

2. The method according to claim 1, wherein the semiconductor particle is a particle consisting of one of ZnSe, ZnO, ZnS, $Zn_xCd_{1-x}Se$, and $Zn_xCd_{1-x}S$, where $0<x<1$.

3. The method according to claim 1, wherein the transition metal of $Cu^{2+}$ emits green light.

4. The method according to claim 1, wherein the transition metal of $Tb^{3+}$ emits green light.

5. The method according to claim 1, wherein the transition metal of $Mn^{2+}$ emits red light.

6. The method according to claim 1, wherein the quantum rod emits a color of light, the rod shape is longer than Bohr radius of excitation of the semiconductor particle, and the transition metal determines the color of light emitted by the quantum rod.

* * * * *